United States Patent [19]
Mitchell et al.

[11] Patent Number: 5,424,685
[45] Date of Patent: Jun. 13, 1995

[54] HIGH-LEVEL MODULATOR WITH BIPOLAR MODULATION REFERENCE

[75] Inventors: Daniel M. Mitchell; Timothy L. Kean, both of Cedar Rapids, Iowa

[73] Assignee: Rockwell International Corporation, Seal Beach, Calif.

[21] Appl. No.: 196,336

[22] Filed: Feb. 10, 1994

[51] Int. Cl.$^6$ .................................................. H03G 3/20
[52] U.S. Cl. ........................................ 330/279; 330/127; 330/285; 455/126; 455/127
[58] Field of Search ............... 330/127, 128, 202, 279, 330/285, 297; 455/126, 127

[56] References Cited

U.S. PATENT DOCUMENTS

| | | | |
|---|---|---|---|
| 4,631,491 | 12/1986 | Smithers | 330/149 |
| 4,933,986 | 6/1990 | Leitch | 455/119 |
| 4,994,757 | 2/1991 | Bickley et al. | 330/285 |
| 5,023,937 | 6/1991 | Opas | 455/126 |
| 5,111,158 | 5/1992 | Malec et al. | 330/297 |
| 5,119,040 | 6/1992 | Long et al. | 330/149 |
| 5,121,077 | 6/1992 | McGann | 330/149 |
| 5,124,665 | 6/1992 | McGann | 330/149 |

*Primary Examiner*—James B. Mullins
*Attorney, Agent, or Firm*—Kyle Eppele; M. Lee Murrah; H. Fredrick Hamann

[57] ABSTRACT

A bipolar modulator and its associated control devices for use with a high-efficiency amplifier in an RF transmitter. The modulator receives an inverted reference signal that has passed through at least two comparators. The modulator output is filtered and then rectified and coupled to a high-efficiency power amplifier.

5 Claims, 2 Drawing Sheets

HIGH-LEVEL MODULATOR WITH BIPOLAR MODULATION REFERENCE

BACKGROUND

The subject invention relates to improving the electrical efficiency of amplifiers and particularly of high power amplifiers.

Many types of modern electronic equipment employ power amplifiers. More specifically, radio frequency (RF) power amplifiers are utilized in transmitters to increase the power level of amplitude modulated signals. For example wherein the magnitude of a fixed frequency carrier signal is continuously varied in accordance with the instantaneous magnitude of a lower frequency modulating signal and the carrier signal define a percentage of amplitude modulation.

A high-efficiency power amplifier (HEPA) typically comprises a variable frequency, fixed duty-cycle, switching amplifier whose modulation characteristics are derived from the waveform of the power supply voltage. That is, the output voltage of the power supply, now more appropriately called a high-level modulator, is programmed to track a variable frequency, variable amplitude reference that contains the desired modulation characteristic, namely the modulation reference.

The high-level modulator must be a switching type of regulator, as opposed to a linear regulator, otherwise the efficiency problem that the HEPA purports to solve is simply transferred to the high-level modulator. Therefore, an LC filtering scheme is required at the output of the modulator itself. It may even be desirable to derive the high-level modulator clock frequency from the HEPA in order to minimize beat frequencies due to system switching, depending upon design requirements.

The problem is that the LC filter at the output of the high-level modulator is unable to differentiate switching noise from some harmonic of the modulation reference waveform. The apparent worst case is the so-called "two-tone" test (as known to those skilled in the art), where the HEPA output consists of two signals with equal amplitudes but different RF frequencies. For such case, the modulation reference is a full-wave rectified sine wave at the difference frequency. A full-wave rectified sine wave has an unlimited frequency spectrum, due to the discontinuity in the waveform, with considerable total harmonic content. To the extent that the output filter of the high-level modulator attenuates these harmonics, tracking is not achieved.

Clearly, no physically realizable LC filtering scheme permits instantaneous tracking of a discontinuous waveform, such as a full-wave rectified sine wave. The accuracy of tracking increases with the resonant frequency of the high-level modulator output filter. This, in turn, implies a higher high-level modulator switching frequency for the same switching frequency attenuation. The higher the high-level modulation switching frequency, the greater the switching losses are and the lower the efficiency of the entire system.

Accordingly, a need exists for an improved apparatus and method for accomplishing high-efficiency power amplification.

SUMMARY

The present invention is directed to an apparatus and method that provides improved high-efficiency power amplification in RF transmitters. One embodiment of the apparatus comprises means for providing an inverted reference signal to means for modulating the signal. Filtering and rectification means are also provided, after signal modulation so that switching losses are minimized. The means for providing the inverted reference signal may comprise a plurality of comparators prior to coupling the signal to the means for modulating. The inverted reference signal effectively eliminates the problem associated where switching noise and harmonics of the modulation reference are indistinguishable to the filtering means.

A method of use for the above described apparatus is also disclosed. The method comprises the steps of providing an inverted signal to a modulator and subsequently filtering and rectifying the modulator output such that switching losses are minimized and indiscernible filtering problems are eliminated.

It is an object of the present invention to provide an RF transmitter system capable of increased operating efficiency.

It is a feature of the present invention to provide an apparatus that converts the two tone worst case scenario into a best case solution.

It is an advantage of the present invention to utilize a bipolar reference modulated signal which can be rectified at a high-level modulator switching frequency.

The foregoing as well as other objects, features and advantages of the present invention will become better understood from the following detailed description taken in conjunction with the various views of the appended drawings.

DETAILED DESCRIPTION OF ONE EMBODIMENT

Figure 1:
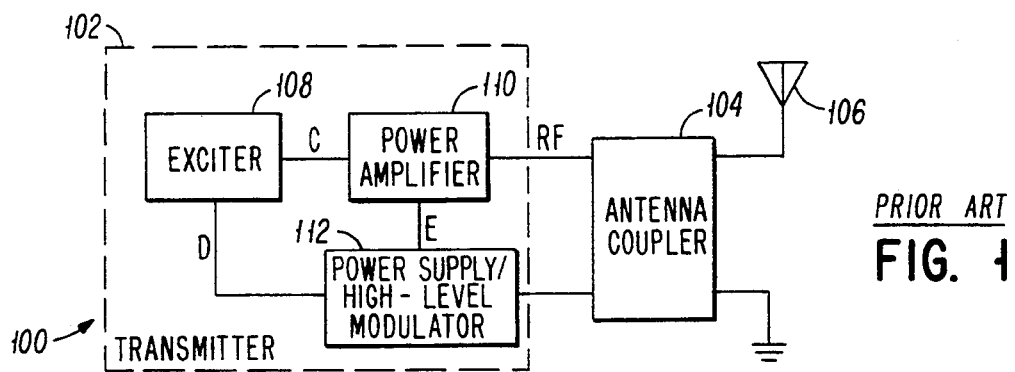
FIG. 1 is a block diagram of a radio system having a high-efficiency power amplifier, as known in the prior art.

Turning now to the Figures wherein like items are referenced as such throughout, FIG. 1 illustrates a system 100 that incorporates a high-efficiency power amplifier (HEPA). A transmitter 102 is shown coupled to an antenna coupler 104 which is in turn coupled to an antenna 106. The transmitter 102 is represented by the dashed lines and comprises various components such as an exciter 108, a power amplifier 110, and a power supply/high-level modulator 112. The exciter 108, the power amplifier 110, and the power supply/high-level modulator 112 are all coupled to each other as depicted by lines C, D, and E.

Figure 2:
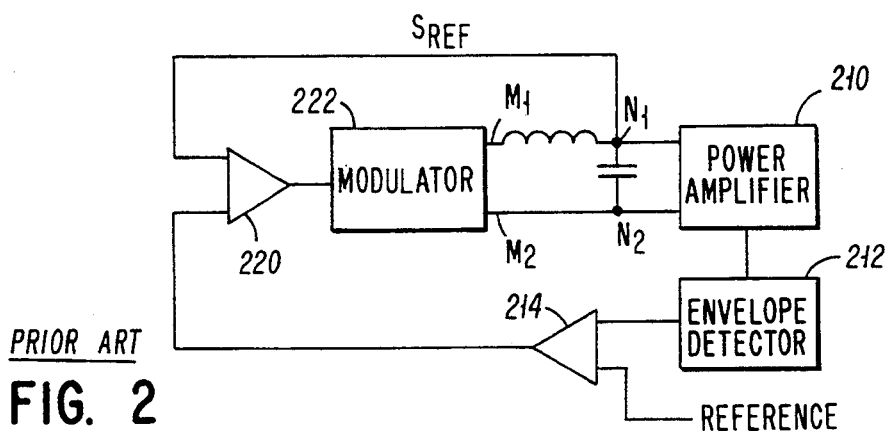
FIG. 2 is a block diagram of a high-level modulator having a simplified LC filtering scheme, as known in the prior art.

FIG. 2 illustrates a high-efficiency power amplifier and its associated control circuitry. The HEPA 210 is shown having a first signal coupled to an envelope detector 212. The output of the envelope detector 212 is coupled as a first input to a first error amplifier 214. The error amplifier 214 receives a second input representative of the desired modulation reference. The output of the error amplifier 214 is coupled to a first input of a second error amplifier 220. The output of error amplifier 220 is coupled to high-level modulator means 222. Signals $M_1$ and $M_2$ are output from the high-level modulator means 222. Signal $M_1$ is coupled through an inductor L, node $N_1$ and into the HEPA 210. Similarly, signal $M_2$ is coupled through node $N_2$ and into the HEPA 210. A feedback signal $S_{REF}$ is coupled to a second input of the error amplifier 220 from the node $N_1$. Additionally, a capacitor C is coupled between nodes $N_1$ and $N_2$.

In typical operation the output signal of the envelope detector 212, is fed to the error amplifier 214 whose reference is the desired modulation envelope. The output of the error amplifier 214 serves as the reference input for the error amplifier 220. The inverted input of error amplifier 214 is an analog of the actual high-level modulator output. It is necessary for the high-level modulator switching frequency to be much higher than the maximum modulation frequency in order to expect reasonable tracking.

Figure 3:
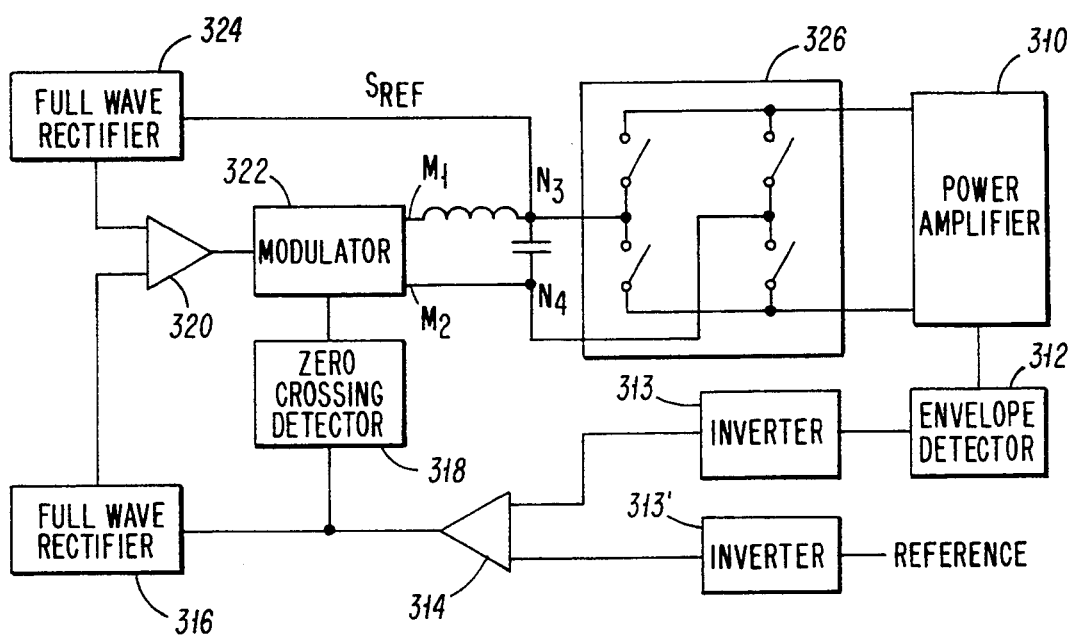
FIG. 3 is a block diagram of a high-efficiency power amplifier that incorporates the teachings of the present invention.

FIG. 3 illustrates a high-efficiency power amplifier and its associated control apparatus that incorporates the teachings of the present invention. The HEPA 310 is shown having a first signal coupled to an envelope detector 312. The output of the envelope detector 312 is coupled through an inverter 313 and serves as a first input to a first error amplifier 314. The error amplifier 314 receives a second input via inverter 313' from the desired modulation reference. The output of error amplifier 314 is coupled to a first input of a second error amplifier 320 after passing through full-wave rectification means 316. The output of the error amplifier 314 is also coupled to a zero crossing detector 318 and on to modulator switching stage 322. The output of error amplifier 320 is also coupled to modulator switching stage 322. Signals $M_1$ and $M_2$ are output from the modulator switching stage 322, are passed through an LC filtering scheme as depicted (and previously described in FIG. 2) and into rectifier means 326. A feedback signal $S_{REF}$ is coupled through full-wave rectifier means 324 and into a second input of the error amplifier 320 from the node $N_3$.

For the two-tone case described above, if the full-wave rectified sine wave modulation reference was inverted at alternate half cycles to form a continuous bipolar modulation reference, and the output of the envelope detector was similarly processed, then the high-level modulator would simply be required to track a theoretically pure sine wave at half the difference frequency and not have to deal with harmonics. Of course, the output of the high-level modulator would similarly be bipolar. Thus, it must be full-wave rectified before being applied to the HEPA 310. However, this rectification process occurs at the modulation frequency rather than the high-level modulator switching frequency. As a result, the associated switching losses in the rectifier are negligible by comparison to those of the high-level modulator, and the conduction losses can be reduced by using MOSFET synchronous rectifiers instead of bipolar diodes. Depending on the voltage levels involved, Schottky rectifiers may be applicable as a simple way to reduce conduction losses.

This approach would convert the two-tone case from a worst-case situation to a best-case situation. For situations where the tones are not of exactly equal amplitude, the envelope never quite reaches zero and there would be a discontinuity whether the alternate half cycle inversion process was invoked or not. Qualitatively, the closer the output of the envelope detector approaches zero, the sharper the waveform cusp will be, the greater the higher frequency harmonic content will be, and the more sense it makes to alternately invert the waveform. The further away from zero the minimum output of the envelope detector is, the smoother the waveform will be such that at some point it will be better not to invoke the alternate inversion (i.e. bipolar conversion) process. The control circuitry that is presented in FIG. 4 has means for adjusting the "bipolar threshold" point for the optimum value, as determined by design.

Figure 4:
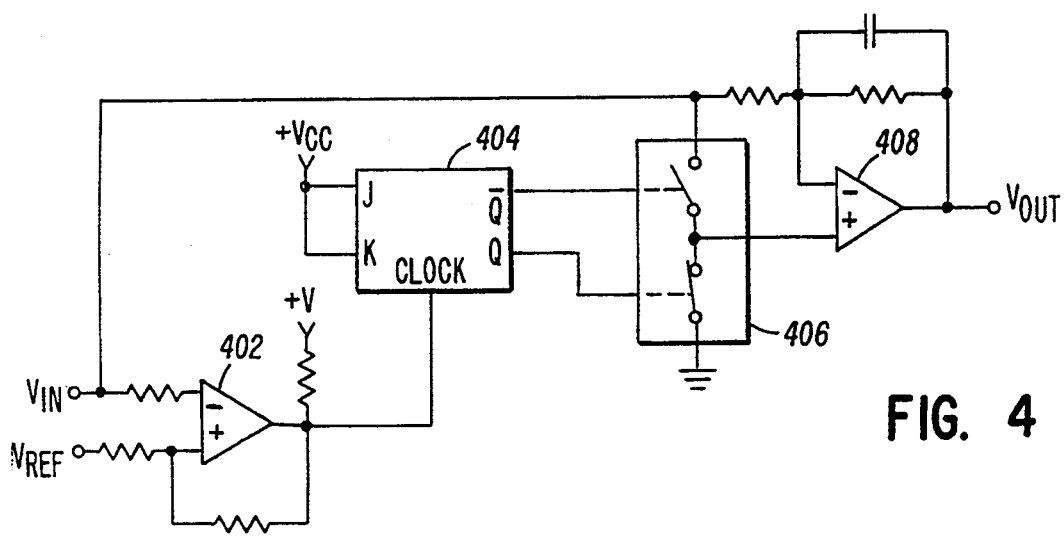
FIG. 4 is a schematic diagram of a modulation reference generator of FIG. 3.

FIG. 4 illustrates one approach to creating the bipolar signal from the modulation reference shown in FIG. 3. Though the modulation reference shown represents a two-tone modulation envelope, in the general sense this could be any shape, such as a voice envelope. A comparator 402 is coupled to a flip-flop circuit 404. The outputs of the flip-flop circuit 404 are coupled to switch 406. Switch 406 is coupled to a second comparator 408 and also to comparator 402. Additional devices and circuitry are shown coupled to the aforementioned elements.

Figure 5:
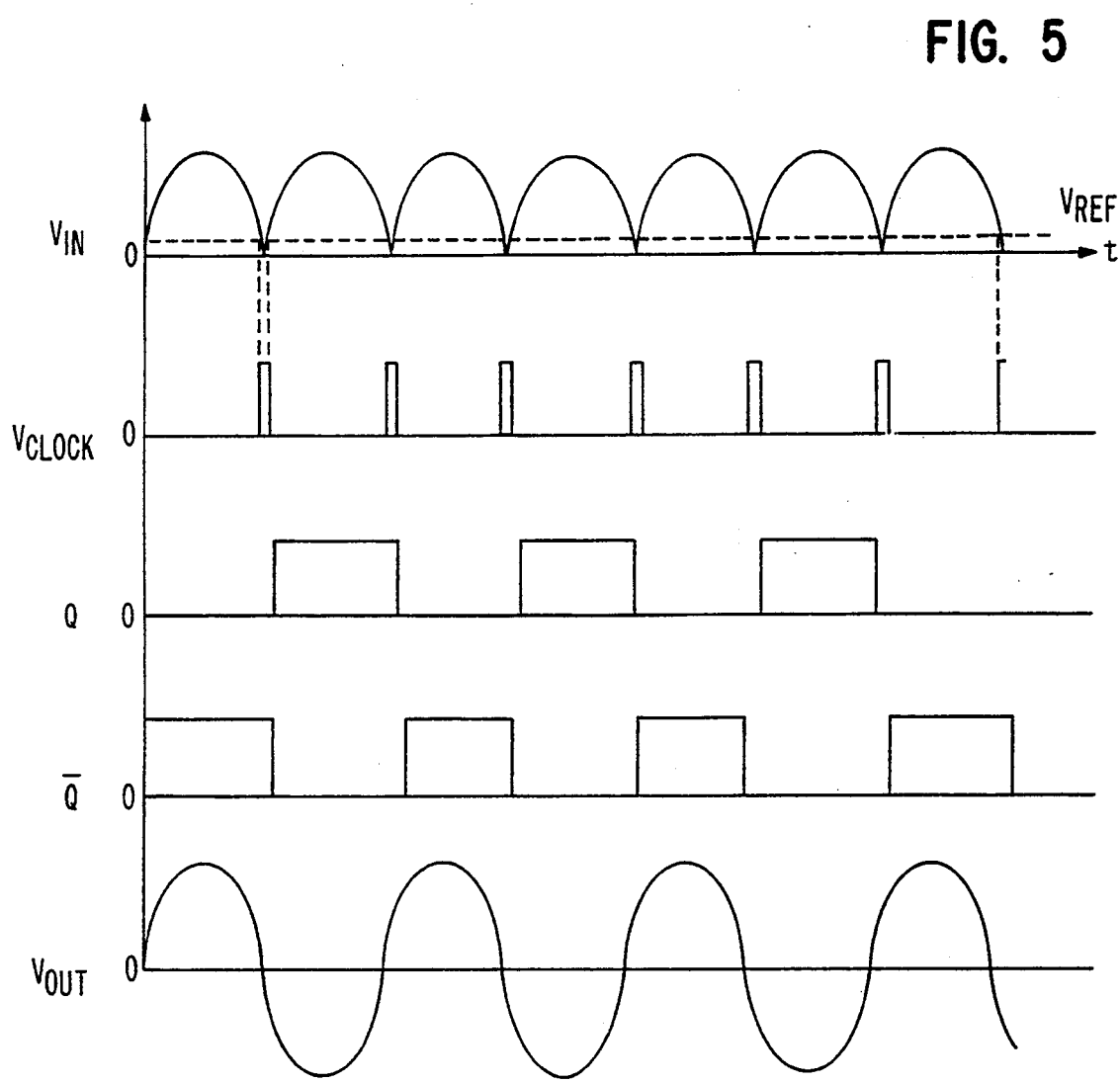
FIG. 5 is a timing diagram of the modulation reference generator of FIG. 4.

FIG. 5 illustrates timing diagrams for various signals in the circuitry of FIG. 4. For anything other than a perfect two-tone situation or a perfect sine-wave modulation process, the high-level modulator must still deal with harmonics of the modulation reference. However, with the addition of the bipolar conversion option, the resonant frequency of the high-level modulator output filter can be significantly reduced, the switching frequency (hence, switching losses) of the high-level modulator can be significantly reduced and the efficiency of the entire systems can be significantly increased. Because the amplifier's input is the modulation reference, its resulting output signal ($V_{OUT}$) is the same reference signal inverted every other cycle.

The bipolar modulation reference generator (FIG. 4), which generates the signal on which the modulator switching stage operates, is a relatively simple circuit. Taking the case of the two-tone test signal envelope, when the modulation reference signal falls within a range close to zero volts ($V_{REF}$), the input comparator 402 generates a pulse. This pulse acts as a standard clock signal to toggle Q and Q-inverted signals to an analog switch at the input of the unity-gain output amplifier which allows switching the amplifier into either the inverting or non-inverting mode. Given that the amplifier output is a replica of that modulation reference signal inverted every half cycle. The signal diagram shown in FIG. 5 represents operation on a two-tone signal; however, the circuit will accept virtually any modulation reference shape, causing it to invert in a like manner whenever it approaches the near-zero window. Note that it does not matter whether the sign of the bipolar reference signal matches that of the original modulation reference signal at any point in time, since the signal is converted back to an all-positive signal following its processing by the modulator switching stage.

Those skilled in the art will readily recognize that various modifications and changes may be made to the present invention without departing from the true spirit and scope thereof, which is set forth in the following claims.

We claim:

1. An apparatus for use with a high-efficiency power amplifier comprising:
   means for determining an inverted signal;
   modulator means coupled to said means for determining the inverted signal;
   filtering means coupled to said modulator means output signal; and
   means for rectifying the signal routed through the means for filtering, said means for rectifying coupled to the high-efficiency power amplifier;
   wherein the means for rectifying the output signal of the means for modulating is set to the modulator means frequency.

2. The apparatus of claim 1 wherein the means for determining an inverted signal is comprised of an error voltage amplifier that receives a first inverted input signal from the high-efficiency power amplifier and an inverted reference signal that serves as a reference input signal against the first inverted input signal.

3. The apparatus of claim 2 wherein an output signal from the means for determining an inverted signal and a feedback signal from the modulator means, are each coupled through full wave rectification means.

4. A method of providing a high-efficiency power amplifier a high-level modulated signal of maximum system efficiency comprising the steps of:

coupling a first inverted reference signal to a first comparator;
   coupling a second inverted signal, from an envelope detector that is coupled to the high-efficiency powder amplifier to the first comparator;
   comparing the first and second inverted signals for determining an error value between the said signals:
   coupling the output signal of the first comparator to a first input terminal of a second comparator:
   coupling a feedback signal from a modulator to a second input terminal of the second comparator;
   comparing the output signal and the feedback signal for determining an error value between said output signal and said feedback signal;
   modulating the output of the second comparator;
   filtering the modulator output signal to attenuate switching noise; and
   rectifying the output signal of the filtered modulated output signal prior to coupling such signal to the high-efficiency power amplifier.

5. The method of claim 4 further comprising the step of full-wave rectifying said output signal of the first comparator and said feedback signal prior to coupling each to the second comparator.

* * * * *